United States Patent [19]

Hojyo

[11] Patent Number: 5,559,364
[45] Date of Patent: Sep. 24, 1996

[54] LEADFRAME

[75] Inventor: Tetsuya Hojyo, Sakai, Japan

[73] Assignee: Contex Incorporated, Osaka, Japan

[21] Appl. No.: 195,340

[22] Filed: Feb. 14, 1994

[30] Foreign Application Priority Data

Feb. 15, 1993 [JP] Japan .................................. 5-048582

[51] Int. Cl.⁶ .............................................. H01L 23/495
[52] U.S. Cl. ............................................. 257/666; 257/674
[58] Field of Search .................................. 257/666, 667, 257/669, 674

[56] References Cited

U.S. PATENT DOCUMENTS

| | | | |
|---|---|---|---|
| 4,899,207 | 2/1990 | Hallowell et al. | 257/668 |
| 5,031,022 | 7/1991 | Yamamoto et al. | 257/668 |
| 5,072,280 | 12/1991 | Matsukura | 257/668 |
| 5,177,591 | 1/1993 | Emanuel | 257/674 |
| 5,294,827 | 3/1994 | McShane | 257/666 |

*Primary Examiner*—Sara W. Crane
*Assistant Examiner*—S. V. Clark
*Attorney, Agent, or Firm*—Nikaido Marmelstein Murray & Oram LLP

[57] ABSTRACT

A low-cost leadframe in which leads are stably and securely retained. The leadframe is provided with a lead retaining section for securely retaining internal leads together. Such a lead retaining section is molded from the same thermosetting resin as used for molding a resin encapsulated package and formed on the internal leads on the side of a die pad such that it extends, in the form of a strip, over the surfaces of the internal leads arranged in rows and such that it is adhered to the internal leads and embedded in the gaps between the internal leads.

32 Claims, 8 Drawing Sheets

5,559,364

LEADFRAME

BACKGROUND OF THE INVENTION

1. Field of the Invention

The present invention relates to a leadframe, and more particularly to a leadframe used for fabrication of an IC package or LSI package and formed in such a way that the interconnection patterns of a die pad and leads are stamped on a strip of metal sheeting and after the die pads and leads have undergone fabrication processes such as chip-mounting, bonding and packaging, the metal strip is cut into pieces to produce devices.

2. Description of the Prior Art

In recent years, as ICs and LSIs call for increasingly higher level of accuracy and integration, such a lead frame is becoming smaller and thinner with more leads contained therein. In order to avoid the irregularity and deformation of leads during the processes of partial plating, die-pad depressing and bonding, it is necessary to securely retain the leads which are arranged in rows around a die pad, radially extending therefrom.

For securely retaining the leads in place, a polyimide resin film was previously used and the reverse side of such a film was coated with an adhesive made from an epoxy resin. The polyimide resin film is stamped out in the pattern corresponding to the leads of a leadframe and affixed to the leads so as to extend like a strip over their surfaces, whereby the leads can be securely kept together in place.

When a resin encapsulated package is molded, a molding die is set so as to hold the leadframe from its opposite sides, with leads pinched between the upper and lower dies. This often causes clearances between the leads in the molding die and resin is likely to escape from these clearances.

In order to prevent the escape of resin, the prior leadframe is provided with dam bars for connecting the leads of a leadframe which are formed during the pattern formation of the die pad and leads.

Another problem is that high level of integration in ICs and LSIs leads to increased heat generation. It is therefore necessary to take a heat dissipation measure.

In order to dispose of unwanted heat, a heat sink is attached to the outer face of a resin encapsulated package. The heat sink is securely held, being bonded to the leads of a leadframe through a polyimide resin film when a resin encapsulated package is molded. The polyimide resin film is stamped out in a specified pattern suitable for attaching the heat sink and coated with an adhesive made from an epoxy resin at its front and reverse sides.

SUMMARY OF THE INVENTION

The above method in which leads are securely retained using a polyimide resin film the reverse side of which is coated with an adhesive of epoxy resin, however, presents the disadvantage that, since the polyimide resin film is affixed only to the surface of the leads, its bonding strength is not strong enough to prevent the polyimide resin film from peeling off the leads. Further, it is difficult to securely retain the leads by the use of such a thin polyimide resin film, so that the leads tend to warp in wavy form. A further problem is that stamping-out of the polyimide resin film in the pattern corresponding to the leads of a leadframe causes a lot of waste resin, resulting in a high cost because the polyimide resin film is expensive.

When dam bars are used for preventing the escape of resin, the dam bars need to be removed by a press die after molding in order to form leads. In view of the current trend towards higher integrated leadframes with more leads, it is difficult and costly to manufacture the press die used for removing dam bars. The use of dam bars also imposes another problem in that the humidity resistance of an IC package or LSI package is considerably reduced since the close contact of leads with a resin encapsulated package is impaired when dam bars are removed by a press die.

The method, in which a heat sink is attached to leads through a polyimide resin film coated with an adhesive made from an epoxy resin at the front and reverse sides, has the same disadvantage as pointed out above. Specifically, the polyimide resin film adheres only to the surfaces of leads and to the heat sink with insufficient bonding strength, so that the polyimide resin film easily peels off the leads or the heat sink comes off the polyimide resin film, before molding of a resin encapsulated package, resulting in a drop of the heat sink.

The invention has been made in consideration of the foregoing problems and an object of the invention is therefore to provide an inexpensive leadframe in which leads are stably, securely retained.

Another object of the invention is to provide a leadframe in which a flow-out of resin is positively prevented at a low cost.

Still another object of the invention is to provide a leadframe in which a heat sink is securely retained.

For accomplishing the first object, there has been provided, in accordance with the invention, a leadframe having a lead retaining section for securely retaining internal leads together, the lead retaining section being formed by resin molding on the internal leads arranged in rows on the side of a die pad so as to be adhered to the internal leads and embedded in the gaps between the internal leads.

In the above arrangement, the internal leads are not retained by the use of a polyimide resin film the reverse side of which is coated with an adhesive made from an epoxy resin but securely retained by the lead retaining section formed by resin molding. Moreover, such a lead retaining section is so molded as to be adhered to the internal leads and embedded in the gaps between the internal leads. The above arrangement enables it to stably, securely retain the internal leads at a low cost.

The second object can be achieved by a leadframe according to the invention having a resin flow-out interrupting section for preventing a flow-out of resin during molding of a resin encapsulated package, the resin flow-out interrupting section being formed by resin molding on internal leads arranged in rows, being close to and inside the outline of the resin encapsulated package such that it is adhered to the internal leads and embedded in the gaps between the internal leads.

In the above arrangement, a flow-out of resin during molding of the resin encapsulated package is not prevented by the use of dam bars for connecting the leads but prevented by the flow-out interrupting section which is formed by resin molding at a position close to and inside the outline of the resin encapsulated package, and such a resin flow-out interrupting section is so molded as to be embedded in the gaps between the internal leads. This arrangement eliminates the necessity for the removal of the resin flow-out interrupting section after molding so that preventing of a flow-out of resin can be achieved at a low cost.

The third object can be achieved by a leadframe according to the invention having a heat sink retaining section for securely retaining a heat sink on the reverse sides of internal leads arranged in rows, the heat sink retaining section being formed by resin molding at a position on the internal leads where the heat sink is to be fixed, such that it is adhered to the internal leads and embedded in the gaps between the internal leads.

In the above arrangement, the heat sink retaining section for securely retaining the heat sink is formed firmly by resin molding so as to be adhered to the internal leads and embedded in the gaps between the internal leads. With this arrangement, the heat sink can be stably, securely retained by bonding it to the heat sink retaining section, for example, by thermo-compression.

Preferably, the lead retaining section and the resin flow-out interrupting section may be formed so as to extend over the surfaces of the internal leads while the heat sink retaining section may be formed so as to extend over the reverse sides of the internal leads. The lead retaining section may extend in the form of a strip over the internal leads on the side of the die pad. The resin flow-out interrupting section may extend in the form of a strip over the internal leads, being close to and inside the outline of the resin encapsulated package. The heat sink retaining section may be formed at a position on the internal leads where the heat sink is to be fixed.

The lead retaining section, resin flow-out interrupting section and heat sink retaining section may be formed from the same resin as used for forming the resin encapsulated package. Among the resins that may be used is a thermosetting resin such as an epoxy resin and polyimide resin.

Other objects of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitations of the present invention, and wherein:

FIG. 1 is a partially enlarged perspective view of the leadframe before molding a resin encapsulated package, when viewing from its surface side;

FIG. 2 is a partially enlarged plan view of the leadframe before molding the resin encapsulated package;

FIG. 3 is a partially enlarged plan view of the leadframe after molding the resin encapsulated package;

FIG. 4 is a partially enlarged perspective view of a base material in the form of a sheet;

FIG. 5 is a partially enlarged perspective view of sheet-like pieces for the lead retaining section and the resin flow-out interrupting section, these pieces being stamped out from the sheet-like base material;

FIG. 6 is a partially enlarged longitudinal section of the leadframe immediately before the sheet-like pieces for the lead retaining section and the resin flow-out interrupting section being pressed by a hot press die;

FIG. 7 is a partially enlarged longitudinal section of the leadframe when the resin encapsulated package is molded by a molding die;

FIG. 8 is a partially enlarged perspective view of the leadframe before molding a resin encapsulated package, when viewing from its reverse side, which corresponds to FIG. 1;

FIG. 9 is a partially enlarged perspective view of a base material in the form of a sheet, which corresponds to FIG. 4;

FIG. 10 is a partially enlarged perspective view of a sheet-like piece for the heat sink retaining section stamped out from the sheet-like base material, which corresponds to FIG. 5;

FIG. 11 is a partially enlarged longitudinal section of the leadframe immediately before the sheet-like piece for the heat sink retaining section being pressed by a hot press die, which corresponds to FIG. 6;

FIG. 12 is a partially enlarged longitudinal section of the leadframe when the resin encapsulated package is molded by a molding die, which corresponds to FIG. 7.

DESCRIPTION OF THE PREFERRED EMBODIMENTS

Figure 1:
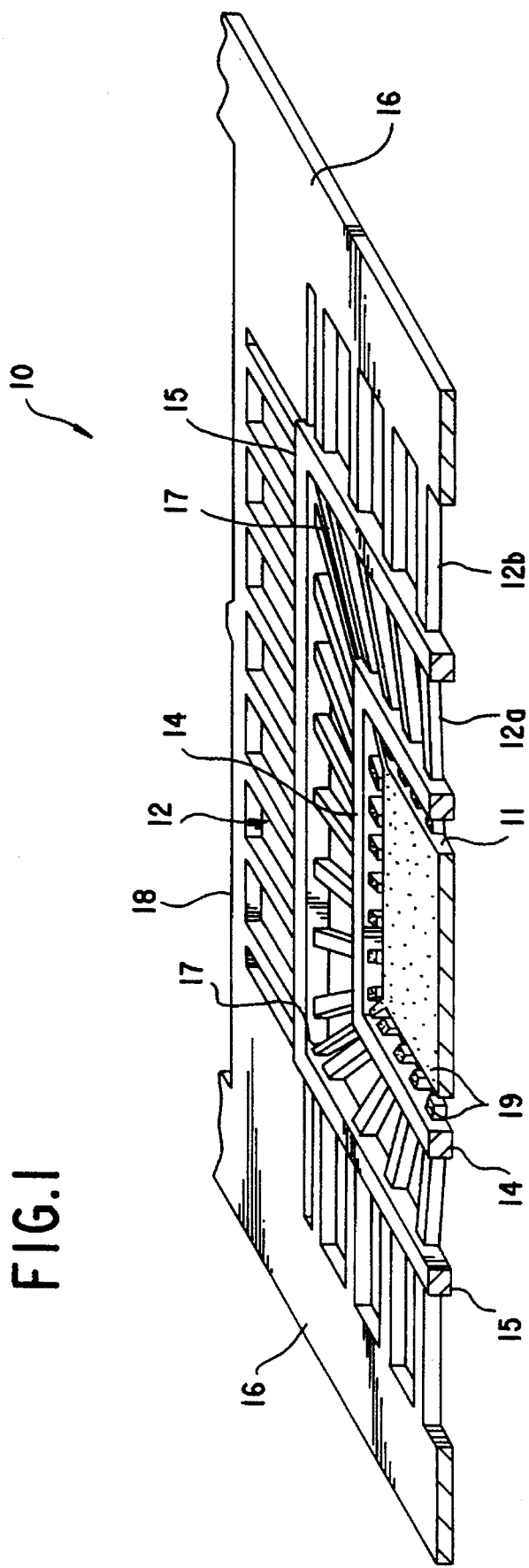
FIGS. 1 to 7 are for explaining an embodiment of a leadframe according to the invention in which a lead retaining section and a resin flow-out interrupting section are formed by resin molding.

Referring now to the drawings, preferred embodiments of a leadframe according to the invention will be described hereinbelow.

Figure 2:
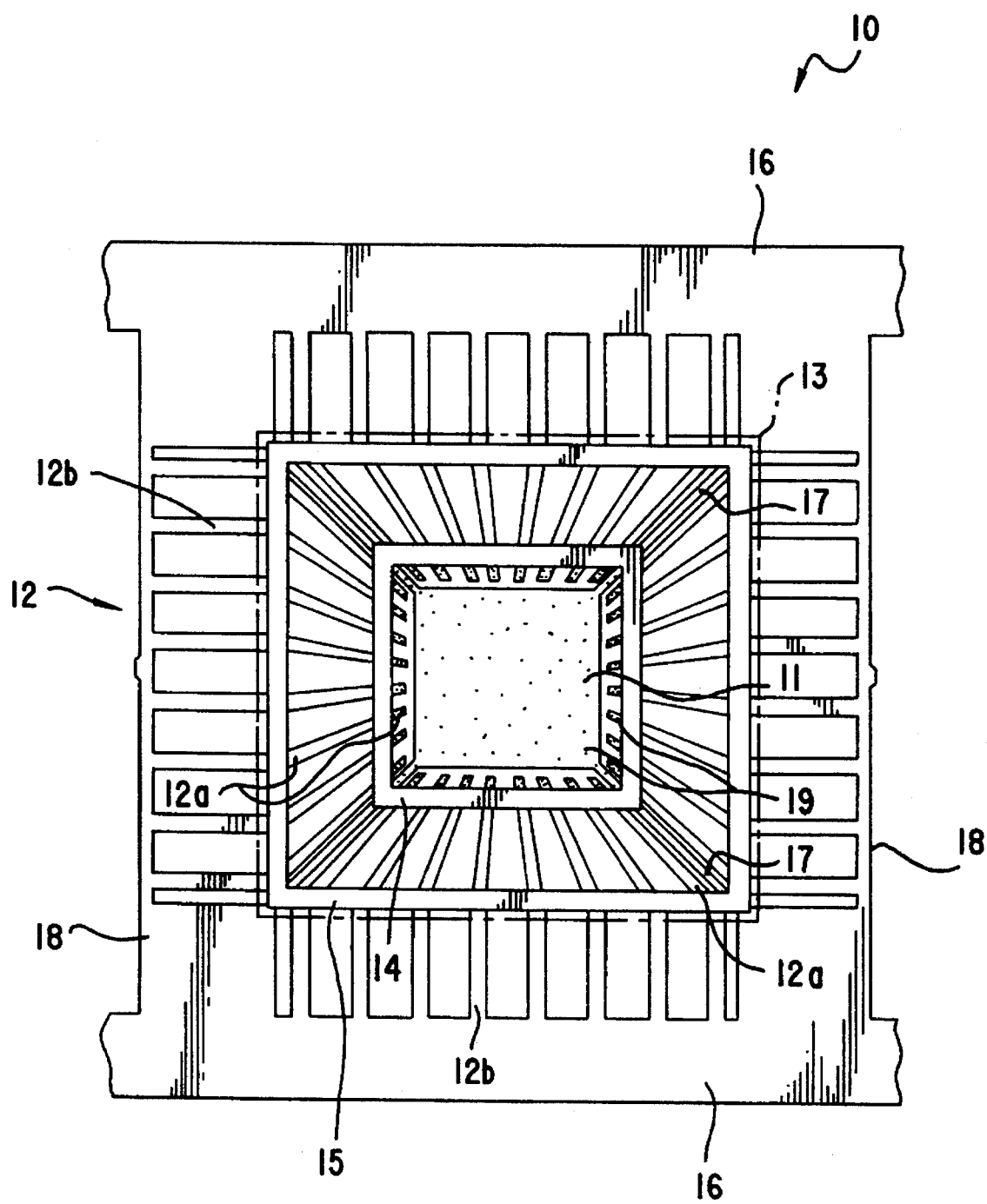
Figure 3:
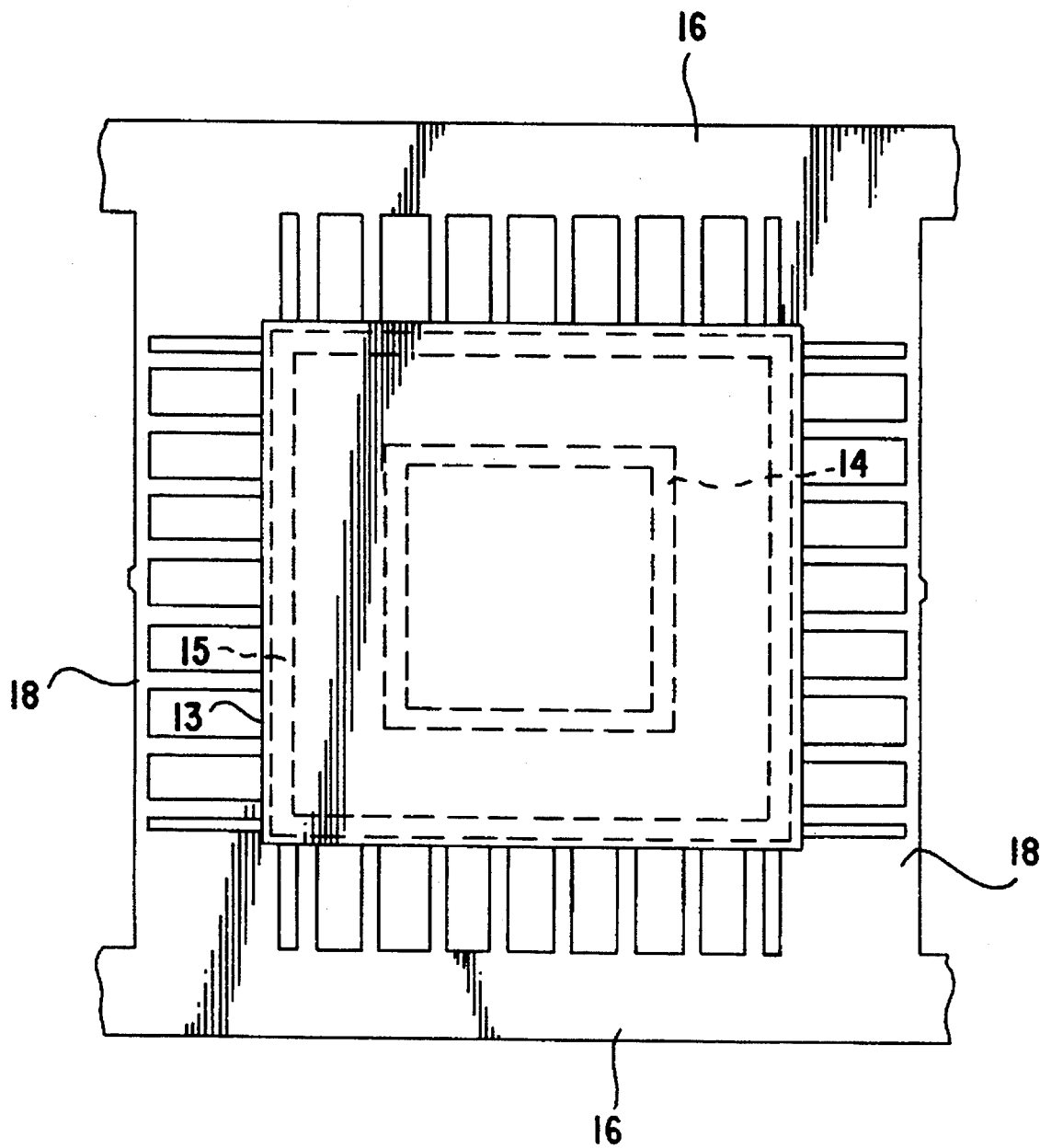

In FIGS. 1 and 2, a leadframe 10 has, at a center thereof, a flat die pad 11 to which a chip is to be bonded. Leads 12 are arranged in rows around the die pad 11, radially expanding therefrom. The leads 12 aligned inside the outline of a resin encapsulated package 13 indicated by chain line in FIG. 2 are referred to as internal leads 12a, while those outside the outline of the resin encapsulated package 13 are referred to as external leads 12b. A lead retaining section 14 is disposed in the leading ends of the internal leads 12 on the side of the die pad 11. This lead retaining section 14 is made in the form of a strip, extending across the respective surfaces of the internal leads 12a. In this embodiment, the lead retaining section 14 takes the form of "figure of □", as a whole. A resin flow-out interrupting section 15 in the form of a strip is provided over the surfaces of the internal leads 12, being close to and inside the outline of the resin encapsulated package 13. The whole configuration of the resin flow-out interrupting section 15 in this embodiment is also "figure of □", like the lead retaining section 14. These lead retaining section 14 and resin flout interrupting section 15 are respectively formed by resin molding such that they are adhered to the internal leads 12a and embedded in the gaps between the internal leads 12a. The resin used for forming the sections 14 and 15 is the same thermosetting epoxy resin as used for forming the resin encapsulated package 13. After molding the resin encapsulated package 13, the lead retaining section 14 and the resin flow-out interrupting section 15 are embedded within the resin encapsulated package 13, as shown in FIG. 3. In the drawings, reference numerals 16, 17, 18 and 19 denote a side rail, tie bar, section bar and partially plated part, respectively.

A forming method for the lead retaining section 14 and the resin flow-out interrupting section 15 will be described in order of the forming steps with reference to the drawings.

Figure 4:
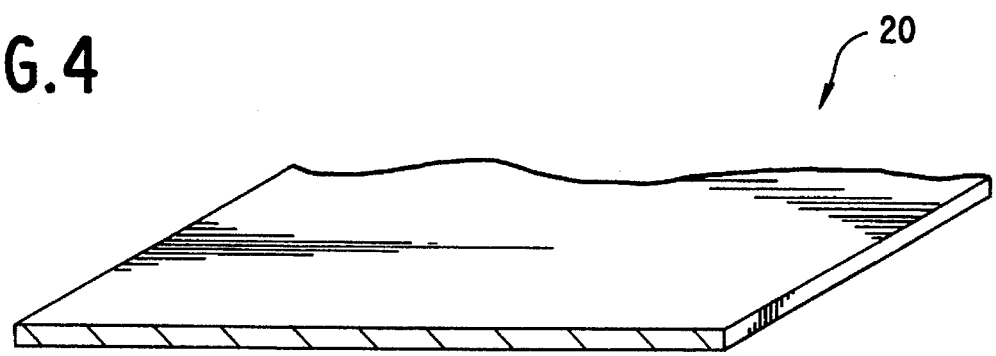

(1) The same powdered thermosetting epoxy resin as used for forming the resin encapsulated package 13 is formed into a sheet of a specified thickness, thereby to produce a sheet-like base material 20 (see FIG. 4).

Figure 5:
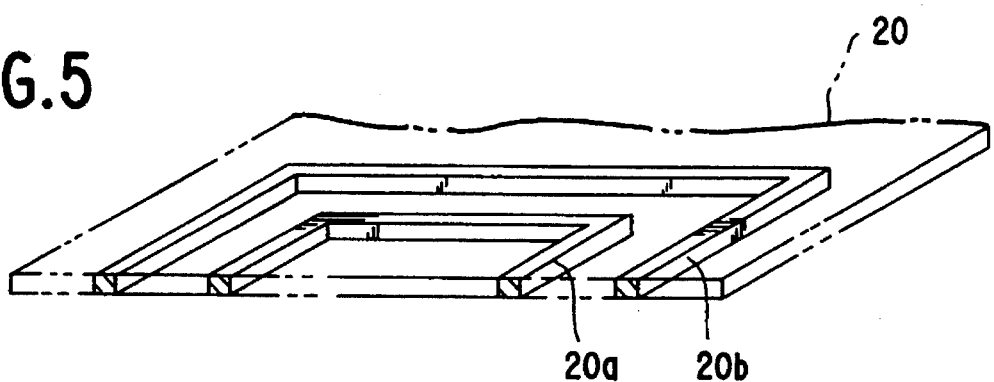

(2) The sheet-like base material 20 is cut into a "figure of □" pattern as a whole to form a first sheet-like piece 20a for the lead retaining section 14. The first sheet-like piece 20a has such a specified configuration that when the piece 20a is attached to the leadframe 20, it surrounds the die pad 11, extending like a strip over the internal leads 12a on the side of the die pad 11. In the meantime, the base material 20 is cut into a "figure of □" pattern as a whole similar to that of the first sheet-like piece 20a, thereby forming a second sheet-like piece 20b for the resin flow-out interrupting section 15 (see FIG. 5). The second sheet-like piece 20b has such a specified configuration that when the piece 20b is attached to the leadframe 10, it extends over the internal leads 12a like a strip, being close to and inside the outline of the resin encapsulated package 13 (see FIG. 5).

(3) The first sheet-like piece 20a is placed on the surfaces of the internal leads 12a on the side of the die pad 11 such that it extends like a strip over the internal leads 12a. The second sheet-like piece 20b is placed on the surfaces of the internal leads 12a, being close to and inside the outline of the resin encapsulated package 13, such that it extends like a strip over the internal leads 12a.

Figure 6:
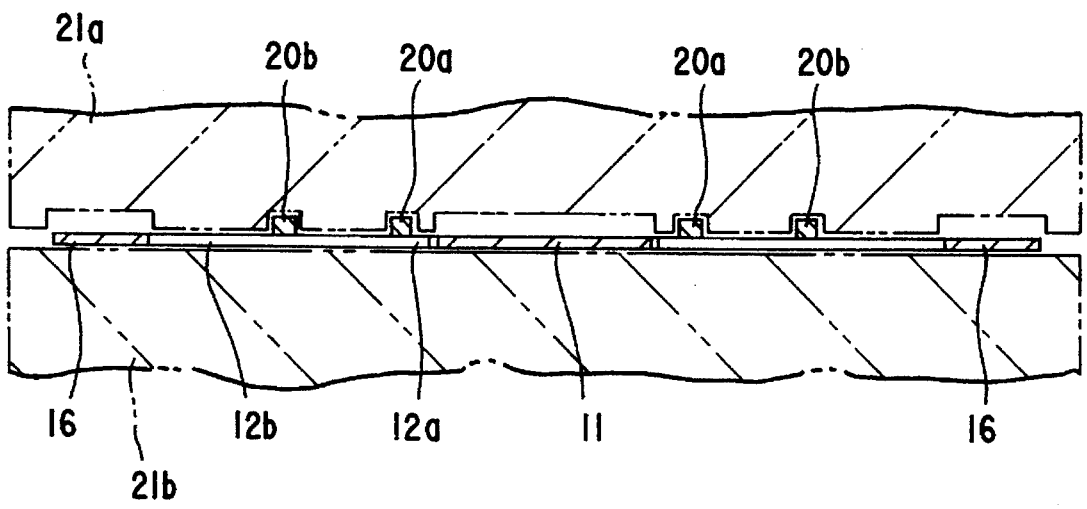

(4) The first and second sheet-like pieces 20a, 20b thus placed are pressed by upper and lower hot press dies 21a and 21b, being pressurized and heated to about 100° C. at which the epoxy resin is brought into a molten state, so that the first and second sheet-like pieces 20a, 20b are respectively melted and adhered to each of the internal leads 12a, while flowing into the gaps between the internal leads 12a (see FIG. 6).

The lead retaining section 14 and the resin flow-out interrupting section 15 are accordingly formed on the internal leads 12a such that they are adhered to the internal leads 12a, with some parts embedded in the gaps therebetween and other parts formed on the surface of each internal lead 12a so as to be thin and uniform in thickness.

Figure 7:
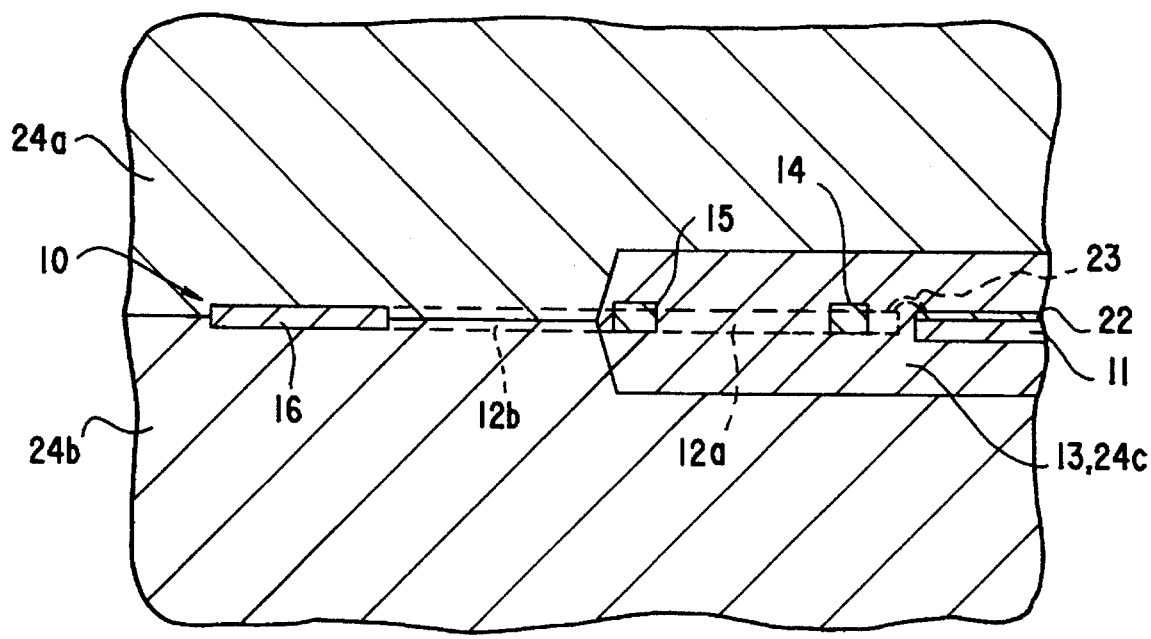

Thereafter, a chip 22 is mounted on and bonded, for example, by a wire 23 as shown in FIG. 7 to the die pad 11 in the leadframe 10 in which the lead retaining section 14 and the resin flow-out interrupting section 15 are formed by resin molding and the die pad 11 is depressed. After bonding the chip 22, the leadframe 10 is placed between the upper and lower molding dies 24a, 24b such that the external leads 12b are pinched between the upper and lower molding dies 24a, 24b and the lead retaining section 14 and the resin flow-out interrupting section 15 are positioned in a cavity 24c as shown in FIG. 7. Then, molten epoxy resin for forming the encapsulated package 13 is introduced into the cavity 24c and hardened by heat and pressure to form the resin encapsulated package 13.

Since the resin used for forming the resin encapsulated package 13 is the same as that used for molding the lead retaining section 14 and the resin flow-out interrupting section 15, the resin encapsulated package 13 can be integrally formed with the lead retaining section 14 and the resin flow-out interrupting section 15 at the time of molding. Furthermore, since the lead retaining section 14 and the resin flow-out interrupting section 15, which are adhered to the internal leads 12a and embedded in the gaps therebetween, are integral with the inside of the resin encapsulated package 13, strong, effective resin molding can be achieved. Since the resin flow-out interrupting section 15 is formed from the same resin as that used for forming the resin encapsulated package 13 as mentioned above, it possesses insulating properties unlike the conventional dam bars. In addition, since the resin flow-out interrupting-section 15 is integral with the inside of the resin encapsulated package 13, there is no need to remove it after molding the resin encapsulated package 13. Further, since there is no need to remove the resin flow-out interrupting section 15 after molding the resin encapsulated package 13, the deformation and damage of the leads 12 caused by the removal can be avoided and the resin encapsulated package 13 does not peel off the leads 12.

Figure 8:
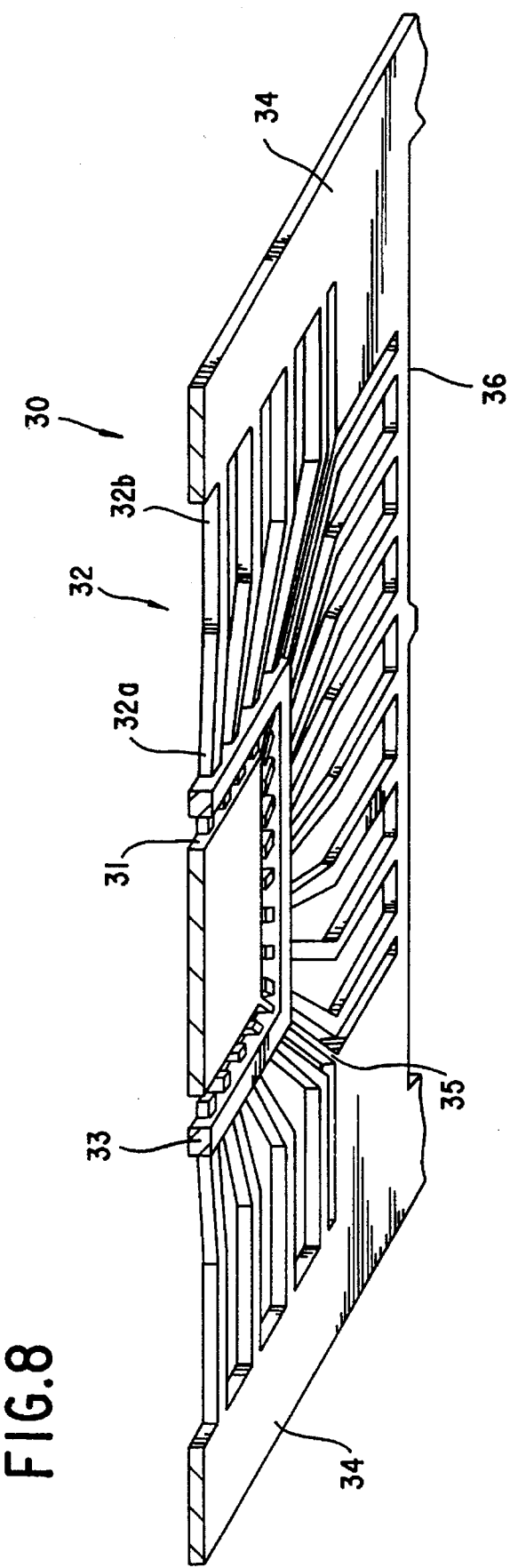
FIGS. 8 to 12 are for explaining another embodiment of the leadframe of the invention in which a heat sink retaining section is formed by resin molding.

FIG. 8 shows another leadframe 30 in which a flat die pad 31 to which a chip is to be bonded is provided, at its center and leads 32 are arranged in rows around the die pad 31, extending radially therefrom, like the foregoing embodiment. On the reverse sides of internal leads 32a of the aligned leads 32 is disposed a heat sink retaining section 33. The heat sink retaining section 33 extends like a strip over the reverse sides at a position where a heat sink 42 is to be fixed and its whole configuration is "figure of □". Similarly to the lead retaining section 14 and the resin flow-out interrupting section 15, the heat sink retaining section 33 is molded from an epoxy resin such that it is adhered to the internal leads 32a and embedded in the gaps between the internal leads 32. In the drawings, reference numerals 32b, 34, 35 and 36 denote an external lead, side rail, tie bar and section bar, respectively. Others are similar to those in the foregoing embodiment and therefore an explanation will be omitted.

A forming method for the heat sink retaining section 33 will be described in order of the forming steps with reference to the drawings.

Figure 9:
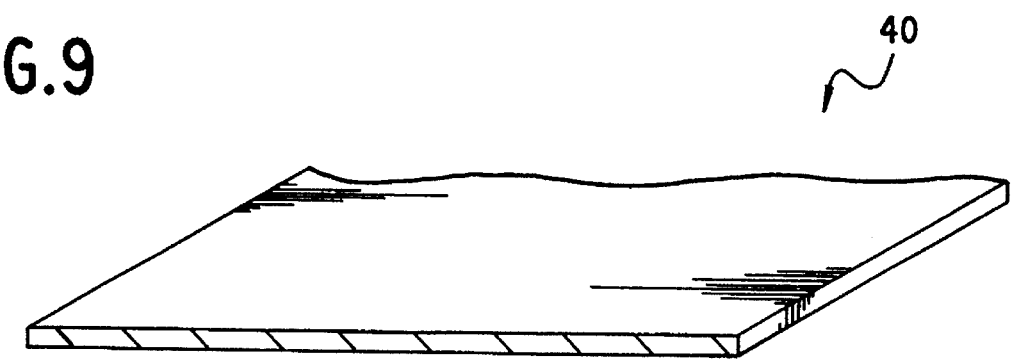

(1) The same powdered thermosetting epoxy resin as used for molding a resin encapsulated package is formed into a sheet of a specified thickness, thereby to produce a sheet-like base material 40 (see FIG. 9).

Figure 10:
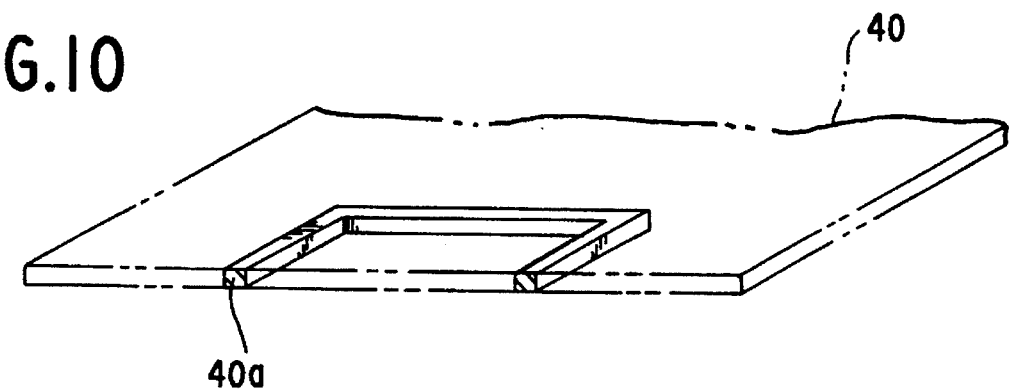

(2) The sheet-like base material 40 is cut into a □ pattern as a whole to form a sheet-like piece 40a for the heat sink retaining section 33 (see FIG. 10). The sheet-like piece 40a has such a specified configuration that when the piece 40a is attached to the leadframe 30, it is placed in a position where the heat sink 42 is to be securely retained, extending across each internal lead 32a like a strip (see FIG. 10).

(3) The sheet-like piece 40a' is placed on the reverse sides of the internal leads 32a at a position where the heat sink 42 is to be securely retained such that it extends over the internal leads 12a in the form of a strip.

Figure 11:
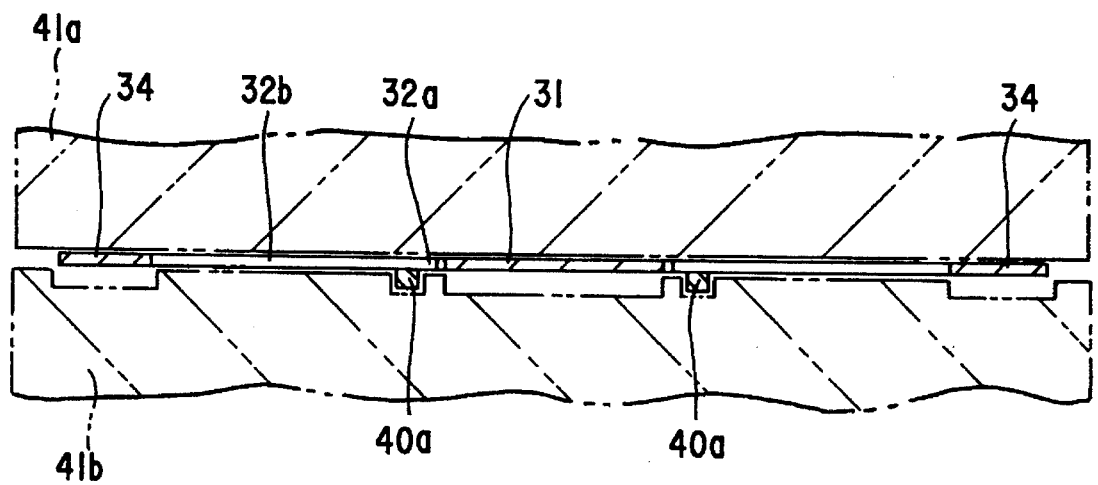

(4) The sheet-like piece 40a is pressed by upper and lower hot press dies 41a and 41b, being pressurized and heated to about 100° C. at which the epoxy resin is brought into a molten state, so that the sheet-like piece 40a is melted and adhered to each of the internal leads 32a, while flowing into the gaps between the internal leads 32a (see FIG. 11).

The heat sink retaining section 33 is accordingly formed by resin molding such that it is adhered to the internal leads 32a and embedded in the gaps between the internal leads 32a.

Figure 12:
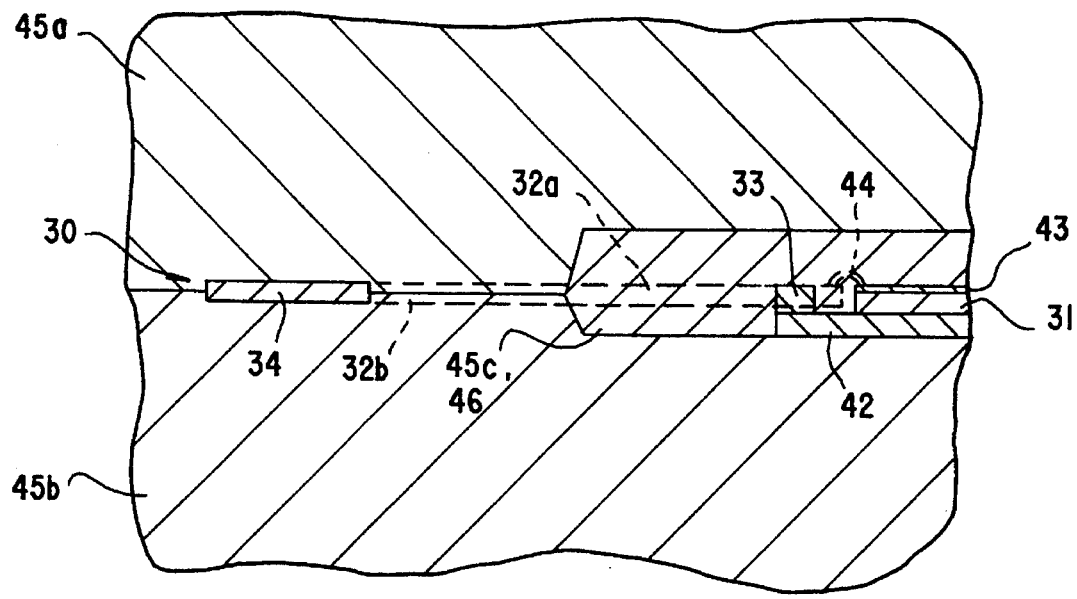

Thereafter, the heat sink 42 is bonded to the heat sink retaining section 33 by thermo-compression and a chip 43 is mounted on and bonded, for example, by a wire 44 as shown in FIG. 12, to the die pad 31 in the leadframe 30 in which the heat sink retaining section 33 is formed by resin molding and the die pad 31 is depressed. After being subjected to the above bonding process, the leadframe 30 is placed between the upper and lower molding dies 45a, 45b, with the heat sink retaining section 33 and the heat sink 42 being positioned in the cavity 45c as shown in FIG. 12. Then, molten epoxy resin for forming the resin encapsulated package 46 is introduced and hardened, thereby molding the resin encapsulated package 46.

Since the resin used for molding the heat sink retaining section 33 is the same as that used for molding the resin encapsulated package 46, the heat sink retaining section 33 is firmly integrated with the inside of the resin encapsulated package 46 when the resin encapsulated package 46 is molded, so that the heat sink 42 can be positively, securely retained.

Although a thermosetting epoxy resin is used for forming the resin encapsulated package in the foregoing embodiments, other thermosetting resins including a polyimide resin may be used. A filler made from silica may be mixed in these thermosetting resins.

Although the foregoing embodiments have been described with the resin encapsulated package 13, 46, lead retaining section 14, resin flow-out interrupting section 15 and heat sink retaining section 33 which are formed from the same thermosetting resin, it is also possible to use different thermosetting resins for forming them.

Although the thickness of each of the base materials 20, 40 has not been particularly mentioned in the foregoing embodiments, the thickness of the base material 20 (40) may be specified in relation to the thickness of the internal lead 12a (32a) of the leadframe 10 (30) as well as the space between the internal leads 12a (32a) such that the molten sheet-like pieces 20a, 20b (40a) flow into and fill up the gaps between the internal leads 12a (32a).

Figure 13:
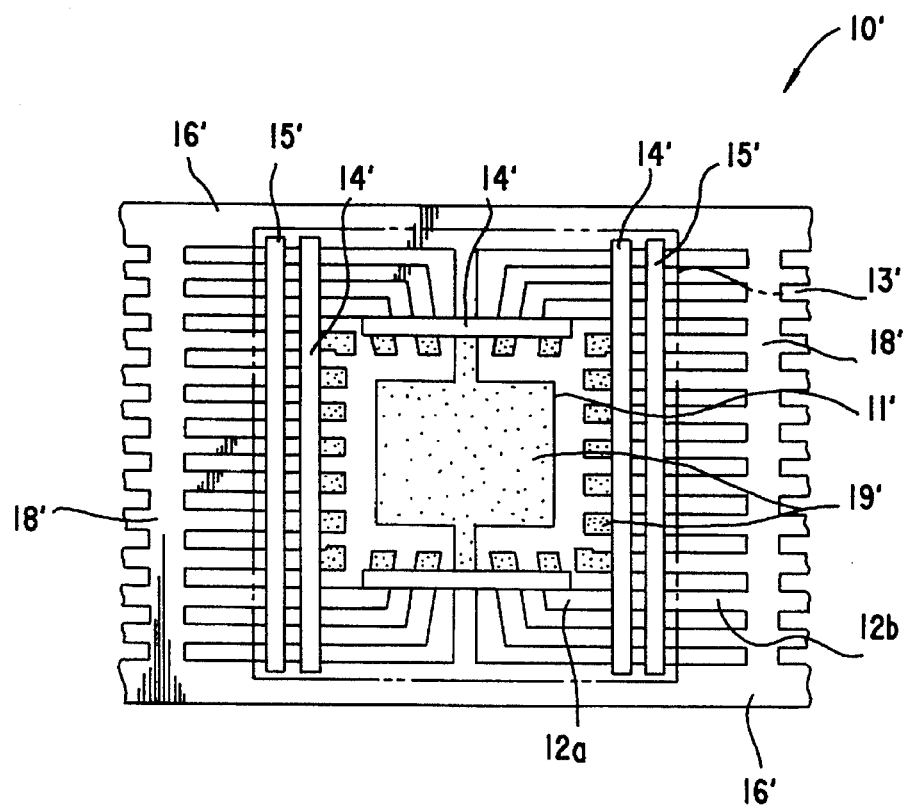
FIG. 13 is a partially enlarged plan view of a leadframe according to a modification of the first embodiment, which corresponds to FIG. 2.

In the foregoing embodiments, the sheet-like pieces 20a, 20b and 40a for the lead retaining section 14, resin flow-out interrupting section 15 and heat sink retaining section 33 are stamped out from the sheet-like base material 20, 40 in the pattern of "figure of □" as a whole. However, the shapes of the sheet-like pieces 20a, 20b and 40a do not necessarily limited to this. Corresponding with the various conditions, for example, they may be stamped out in straight strip patterns which respectively satisfy for forming a straight lead retaining section 14' and a straight resin flow-out interrupting section 15' of a lead frame 10' as shown in FIG. 13. Further, they may be stamped out to take the form of a hollow circle or a hollow rectangle, on a plane view. Press dies may be used when stamping out them from the sheet-like base materials 20, 40.

Although the lead retaining section 14, resin flow-out interrupting section 15 and heat sink retaining section 33 are independently provided in the foregoing embodiments, they may be selectively integrally formed. Although the lead retaining section 14 and the resin flow-out interrupting section 15 are both provided in the foregoing embodiment, either of them may be provided.

In the foregoing embodiments, the sheet-like pieces 20a, 20b (40a) placed on the internal leads 12a (32a) are adhered to the internal leads 12a (32a) and introduced into and filled up the gaps between the internal leads 12a (32a), using hot press dies. Instead of the above process, the following process may be taken: the sheet-like pieces 20a, 20b (40a) placed on the internal leads 12a (32a) are heated to about 180° C. and melted in a heating furnace so as to flow into the gaps between internal leads 12a (32a), and coined and filled up by a coining tool.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A leadframe comprising:

a resin encapsulated package with an inside section;

internal leads, each with a top, bottom and side surfaces, arranged in rows, with respect to said sides of said internal leads, on a side of a die pad, wherein each of said internal leads are in said inside section of said encapsulated package;

a lead retaining section means for securely operationally retaining said internal leads; and wherein said lead retaining section is disposed so as to adhere to said internal leads and so as to be embedded between said side surfaces of said internal leads.

2. The leadframe as claimed in claim 1, wherein the lead retaining section is formed so as to extend over the surfaces of the internal leads.

3. The leadframe as claimed in claim 1 or 2, wherein the lead retaining section is disposed in the form of a strip.

4. The leadframe as claimed in claim 1 or 2, wherein the lead retaining section is formed from the same resin as used for molding a resin encapsulated package.

5. The leadframe as claimed in claim 1 or 3, wherein the resin for forming the resin encapsulated package is a thermosetting resin.

6. A leadframe comprising a lead retaining section for securely retaining leads together, wherein said leads each comprise a top, bottom and side surface and are arranged in rows with respect to said side surfaces, the lead retaining section being formed from a same thermosetting resin as used for forming a resin encapsulated package such that the lead retaining section extends in a form of a strip over top surfaces of internal leads arranged in rows on a side of a die pad, being adhered to side surfaces of the internal leads and embedded in gaps between the sides of the internal leads in an inside portion of said encapsulated package.

7. A leadframe comprising a resin flow-out interrupting section means for preventing a flow-out of resin during formation of a resin encapsulated package, formed with resin on internal leads, wherein said leads each comprise a top, bottom and side surfaces and are arranged in rows with respect to said side surfaces, and wherein said resin flow-out interrupting means is formed close to and inside an outline of a resin encapsulated package such that the resin flow-out interrupting section is adhered the internal leads embedded in gaps between the side surfaces of the internal leads.

8. The leadframe as claimed in claim 7, wherein the resin flow-out interrupting section is formed so as to extend over the surfaces of the internal leads.

9. The leadframe as claimed in claim 7 or 8, wherein the resin flow-out interrupting section is disposed in the form of a strip on the internal leads.

10. The leadframe as claimed in claim 7 or 8, wherein the resin flow-out interrupting section is formed from the same resin as used for molding the resin encapsulated package.

11. The leadframe as claimed in claim 7 or 8, wherein the resin for forming the resin encapsulated package is a thermosetting resin.

12. A leadframe comprising a resin flow-out interrupting section for preventing a flow-out of resin during formation of a resin encapsulated package, formed with resin on internal leads, wherein said leads each comprise a top, bottom and side surfaces and are arranged in rows with respect to said side surfaces, wherein the resin flow-out interrupting section being formed from a same thermosetting resin as used for forming the resin encapsulated package such that the resin flow-out interrupting section is disposed in a form of a strip on internal leads arranged in rows, wherein said resin flow-out interrupting section is close to and inside an outline of the resin encapsulated package and such that the resin flow-out interrupting section extends over surfaces of the internal leads, wherein said resin flow-out interrupting section is adhered to the internal leads and embedded in gaps between the side surfaces of the internal leads.

13. A leadframe comprising a heat sink retaining section means for securely retaining a heat sink on a reverse side of internal leads: wherein said leads each comprise a top, bottom and side surface and are arranged in rows with respect to said side surfaces, the heat sink retaining section being formed by resin at a position on the internal leads where the heat sink is to be fixed, such that the heat sink retaining means is adhered to the internal leads and embedded in the gaps between the sides of the internal leads in an inside portion of an encapsulated package.

14. The leadframe as claimed in claim 13, wherein the heat sink retaining section is formed so as to extend over the reverse side of the internal leads.

15. The leadframe as claimed in claim 13 or 14, wherein the heat sink retaining section is disposed in the form of a strip at a position on the internal leads where the heat sink is to be fixed.

16. The leadframe as claimed in claim 14, wherein the heat sink retaining section is formed from the same resin as used for forming the resin encapsulated package.

17. The leadframe as claimed in claim 14, wherein the resin forming the resin encapsulated package is a thermosetting resin.

18. A leadframe comprising a heat sink retaining section for securely retaining a heat sink on a reverse side of internal leads: wherein said leads each comprise a tip, bottom and side surfaces and are arranged in rows with respect to said side surfaces, the heat sink retaining section being formed from a same thermosetting resin as used for forming a resin encapsulated package, such that the heat sink retaining section is disposed at a position on the internal leads where the heat sink is to be fixed and extends over reverse sides of the internal leads and such that the heat sink retaining section is adhered to the internal leads and is embedded in gaps between the side surfaces of the internal leads.

19. A leadframe as set forth in claim 6, further comprising a resin flow-out interrupting section for preventing a flow-out of resin during forming of the resin encapsulated package, the resin flow-out interrupting section being formed from the same thermosetting resin as used for molding the resin encapsulated package such that the resin flow-out interrupting section is disposed in the form of a strip on the internal leads wherein said resin flow-out interrupting means is formed close to and inside the outline of the resin encapsulated package and such that the resin flow-out interrupting means extends over the surfaces of internal leads and is adhered to the internal leads and embedded in the gaps between the internal leads.

20. A leadframe as set forth in claim 6, further comprising a heat sink retaining section for securely retaining a heat sink on a reverse side of internal leads, the heat sink retaining section being formed from the same thermosetting resin as used for forming the resin encapsulated package, such that the heat sink retaining section is disposed at a position on the internal leads where the heat sink is to be fixed and extends over the reverse sides of the internal leads and such that the heat sink retaining section is adhered to the internal leads and embedded in the gaps between the side surfaces of the internal leads.

21. A leadframe as set forth in claim 12, further comprising a heat sink retaining section for securely retaining a heat sink on reverse sides of the internal leads, the heat sink retaining section being formed from the same thermosetting resin as used for molding the resin encapsulated package, such that the heat sink retaining section is disposed at a position on the internal leads wherein the heat sink is to be fixed and extends over the reverse sides of the internal leads and such that the heat sink retaining section is adhered to the internal leads and embedded in the gaps between the internal leads.

22. A leadframe as set forth in claim 6, further comprising a resin flow-out interrupting section for preventing a flow-out of resin during formation of the resin encapsulated package, the resin flow-out interrupting section being formed from the same thermosetting resin as used for forming the resin encapsulated package such that the resin flow-out interrupting section is disposed in the form of a strip on the internal leads, wherein said resin flow-out interrupting means is formed close to and inside the outline of the resin encapsulated package and such that the resin flow-out interrupting sections extends over the surfaces of internal leads and is adhered to the internal leads and embedded in the gaps between the side surfaces of the internal leads; and a heat sink retaining section for securely retaining a heat sink on a reverse side of the internal leads, the heat sink retaining section being formed from the same thermosetting resin as used for forming the resin encapsulated package, such that the resin encapsulated package is disposed at a position on the internal leads where the heat sink is to be fixed and extends over the reverse sides of the internal leads and such that the heat sink retaining section is adhered to the internal leads and embedded in the gaps between the side surfaces of the internal leads.

23. A leadframe comprising:

an encapsulated package with an inside section wherein said encapsulated package is formed from a resin;

internal leads, each with top, bottom and side surfaces, arranged in rows with respect to said sides of said internal leads on a side of a die pad;

a lead retaining section for securely operationally retaining said internal leads;

wherein said resin lead securing means is disposed in said inside section of said encapsulated package and disposed so as to adhere to said internal leads and so as to be embedded between side surfaces of said internal leads;

a flow-out interrupting section for preventing a flow-out of resin during formation of the resin encapsulated package; and wherein said flow-out interrupting section is disposed in said inside section of said encapsulated package and disposed so as to adhere to said internal leads and so as to be embedded between said surfaces of said internal leads.

24. The leadframe as claimed in claim 23, further comprising a heat sink retaining section for securely retaining a heat sink on a reverse side of the internal leads;

wherein said heat sink retaining section is disposed in said inside section of said encapsulated package and disposed so as to adhere to said internal leads and so as to be embedded between side surfaces of said internal leads.

25. A leadframe comprising an encapsulated package with an inside section wherein said encapsulated package is formed from a resin;

internal leads, each with top, bottom and side surfaces, arranged in rows with respect to said sides of said internal leads on a side of a die pad;

a lead retaining section for securely operationally retaining said internal leads;

wherein said resin lead securing means is disposed in said inside section of said encapsulated package and disposed so as to adhere to said internal leads and so as to be embedded between side surfaces of said internal leads;

further comprising a heat sink retaining section for securely retaining a heat sink on a reverse side of the internal wherein said heat sink retaining section is disposed in said inside section of said encapsulated package and disposed so as to adhere to said internal leads and so as to be embedded between side surfaces of said internal leads.

26. A leadframe comprising flow-out interrupting section for preventing a flow-out of resin during formation of the resin encapsulated package;

wherein said flow-out interrupting section is disposed in said inside section of said encapsulated package and disposed so as to adhere to said internal leads and so as to be embedded between said surfaces of said internal leads;

further comprising a heat sink retaining section for securely retaining a heat sink on a reverse side of the internal wherein said heat sink retaining section is disposed in said inside section of said encapsulated package and .disposed so as to adhere to said internal leads and so as to be embedded between side surfaces of said internal leads.

27. The leadframe as claimed in claim 6, further comprising a metallic leadframe.

28. The leadframe as claimed in claim 7, further comprising a metallic leadframe.

29. The leadframe as claimed in claim 12, further comprising a metallic leadframe, 30. The leadframe as claimed in claim 13, further comprising a metallic leadframe.

31. The leadframe as claimed in claim 18, further comprising a metallic leadframe.

32. The leadframe as claimed in claim 23, 25 further comprising a metallic leadframe.

* * * * *